United States Patent
Ahn et al.

(10) Patent No.: US 10,897,329 B2
(45) Date of Patent: Jan. 19, 2021

(54) METHOD AND APPARATUS FOR PERFORMING HARQ ON BASIS OF POLAR CODE

(71) Applicant: LG ELECTRONICS INC., Seoul (KR)

(72) Inventors: Joonkui Ahn, Seoul (KR); Bonghoe Kim, Seoul (KR); Kijun Kim, Seoul (KR); Byounghoon Kim, Seoul (KR); Seunggye Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/475,662

(22) PCT Filed: Dec. 28, 2017

(86) PCT No.: PCT/KR2017/015664
§ 371 (c)(1),
(2) Date: Jul. 2, 2019

(87) PCT Pub. No.: WO2018/124779
PCT Pub. Date: Jul. 5, 2018

(65) Prior Publication Data
US 2019/0349141 A1 Nov. 14, 2019

Related U.S. Application Data

(60) Provisional application No. 62/441,443, filed on Jan. 2, 2017, provisional application No. 62/441,442, filed on Jan. 2, 2017.

(51) Int. Cl.
*G01R 31/28* (2006.01)
*H04L 1/18* (2006.01)
(Continued)

(52) U.S. Cl.
CPC .......... *H04L 1/1812* (2013.01); *H03M 13/13* (2013.01); *H04L 1/0057* (2013.01)

(58) Field of Classification Search
CPC ..... H04L 1/1812; H04L 1/0057; H03M 13/13
See application file for complete search history.

(56) References Cited

U.S. PATENT DOCUMENTS

2016/0294418 A1  10/2016  Huang et al.
2020/0052819 A1*  2/2020  Xu .................... H03M 13/6368

FOREIGN PATENT DOCUMENTS

WO    2015026148    2/2015

OTHER PUBLICATIONS

PCT International Application No. PCT/KR2017/015664, International Search Report dated Apr. 3, 2018, 4 pages.
(Continued)

*Primary Examiner* — Samir W Rizk
(74) *Attorney, Agent, or Firm* — Lee Hong Degerman Kang Waimey

(57) ABSTRACT

Provided are a method and an apparatus for performing a HARQ on the basis of a polar code. The apparatus generates a response bit to a transport block received by a receiver. The apparatus generates a codeword by encoding predefined information bits with a polar code. The apparatus transmits all or some bits of the codeword to the receiver over a physical channel. The response bit is located at a bit having a higher reliability among the predefined information bits. The size of the codeword is determined by a value which supports the minimum coding rate on the basis of the number of the predefined information bits.

7 Claims, 8 Drawing Sheets

(51) Int. Cl.
*H03M 13/13* (2006.01)
*H04L 1/00* (2006.01)

(56) References Cited

OTHER PUBLICATIONS

Huawei, et al., "Polar code design and rate matching", 3GPP TSG RAN WG1 Meeting #86, R1-167209, Aug. 2016, 7 pages.
Huawei, et al., "HARQ scheme for polar codes", 3GPP TSG RAN WG1 Meeting #86, R1-167210, Aug. 2016, 6 pages.
Interdigital Communications, "Performance Evaluation of Puncturing Schemes for Polar Codes", 3GPP TSG RAN WG1 Meeting #86bis, R1-1609898, 8 pages.

* cited by examiner

METHOD AND APPARATUS FOR PERFORMING HARQ ON BASIS OF POLAR CODE

CROSS-REFERENCE TO RELATED APPLICATIONS

This application is the National Stage filing under 35 U.S.C. 371 of International Application No. PCT/KR2017/015664, filed on Dec. 28, 2017, which claims the benefit of U.S. Provisional Application No. 62/441,443, filed on Jan. 2, 2017, and 62/441,442, filed on Jan. 2, 2017, the contents of which are hereby incorporated by reference herein in its entirety.

BACKGROUND OF THE INVENTION

Field of the Invention

The present invention relates to wireless communication, and more particularly, to a method of performing HARQ based on a polar code in a wireless communication system, and an apparatus using the method.

Related Art

In the $3^{rd}$ generation partnership project (3GPP), the overall scheduling and concept for the 5th generation (5G) standard was agreed in the workshop held in September 2015. Enhanced mobile broadband (eMBB), massive machine type communications, ultra-reliable and low latency communication (URLLC), or the like was defined as a top-level use case. In the 3GPP, it was determined to define a new radio (NR) different from the existing long term evolution (LTE) in order to satisfy a service scenario and a new requirement, and both the LTE and the NR were defined as a 5G wireless access technique.

A maximum amount of data that can be transmitted on a communication channel defined mathematically was defined by Shannon in 1948, and was named as channel capacity. A polar code proposed by E. Arikan ("Channel Polarization: A Method for Constructing Capacity-Achieving Codes for Symmetric Binary-Input Memoryless Channels, IEEE TRANSACTIONS ON INFORMATION THEORY, VOL. 55, NO. 7, JULY 2009) in Turkey is a code for asymptotically achieving channel capacity communication for the first time while having practical complexity in a typical channel.

While the 3GPP LTE has used a convolutional code or a turbo code, the introduction of the polar code is underway in the 3GPP NR.

SUMMARY OF THE INVENTION

The present invention provides a method of performing HARQ based on a polar code, and an apparatus using the method.

The present specification proposes a method and apparatus for performing hybrid automatic repeat request (HARQ) based on a polar code in a wireless communication system.

The apparatus includes a radio frequency (RF) unit transmitting and receiving a radio signal and a processor operatively coupled to the RF unit.

First, summarizing terminologies, a transmitter may be a UE, and a receiver may be an eNB.

The transmitter generates a response bit for a transport block received from the receiver.

That is, the receiver may first transmit to the transmitter a data packet including at least one transport block. Herein, it is assumed and described that a response bit indicating ACK/NACK exists for each transport block. For example, if two transport blocks are received, the transmitter may generate a response bit indicating whether ACK/ACK exists for each transport block by using 2 bits. However, this is only one example, and the present invention is not limited to the above embodiment.

The transmitter encodes a predefined information bit with the polar code to generate a codeword. The response bit is located at a bit having high reliability among the predefined information bits.

The predefined information bit may correspond to an input bit of an encoder which performs encoding with the polar code. The number of the predefined information bits may be K. 'a' may denote the number of bits having high reliability among the predefined information bits or the number of the response bits. 'a' may be less than or equal to K. If 'a' is less than K, the response bit may be repeated to configure an information bit to be input to the polar coding encoder.

However, the K bits are not limited to only the predefined information bits, but may correspond to K predefined information bit positions. The 'a' bits may be in a highly reliable order or position at the K predefined information bit positions. Alternatively, the 'a' bits may be in a predetermined order or position at the K predefined information bit positions.

If 'a' is determined as the number of information bits, the value N may vary depending on the value 'a', or a position of an input bit of a highly reliable encoder may vary depending on the value 'a'. However, this operation may become complicated since there is a need to always know the value 'a' which changes dynamically between the UE and the eNB. Therefore, N is obtained based on a predefined value K, and the position of the input bit of the highly reliably encoder is also obtained within the range of the value K, thereby decreasing operational complexity.

The codeword is a value obtained by multiplying the input bit including the information bit and the frozen bit by the coding matrix $G_N$, and the size of the codeword may be expressed by N. The size of the codeword may correspond to the block size of the polar code or the number of bits of the mother code. That is, the codeword may correspond to an output bit of an encoder which performs encoding with the polar code.

A size of the codeword is determined to a value which supports a minimum code rate based on the number of the predefined information bits.

The transmitter transmits all or some bits of the codeword to the receiver through a physical channel.

The all or some bits of the codeword may correspond to a transmission vector m or a coded bit to be actually transmitted at any time. Herein, it is assumed that the all or some bits of the codeword correspond to the coded bit to be actually transmitted at any time. The number of coded bits to be actually transmitted at any time may be denoted by m. That is, a bit in the codeword may be punctured or added to generate m bits.

The codeword is transmitted through the physical channel, and an amount of a radio resource used in transmission of the physical channel may be fixed. Then, the number m of coded bits to be actually transmitted may be fixed irrespective of the number of information bits.

In addition, a predefined value may be transmitted in (K-a) bits excluding the bit having the high reliability among the predefined information bits. The predefined value may be the same as 0, 1, a NACK information value, or a frozen bit. In particular, the same value as the frozen bit may be applied to the NACK information value.

In addition, the codeword may correspond to an output bit of an encoder which performs encoding with the polar code. A value of the codeword size may be N. The N may be power of 2 or a combination of power of 2 and power of 3. The value N of the codeword size may be greater than the number K of the information bits, and (N−K) frozen bits may be encoded with the polar code together with the predefined information bit.

An amount of a radio resource used in transmission of the physical channel may be variable. In this case, the number of all or some bits of the codeword may be determined as a value supporting a code rate of the physical channel. Accordingly, the number of coded bits to be actually transmitted at any time may have a value of (the number of response bits)/(a code rate of a physical channel) or may have a value close thereto, thereby avoiding unnecessary transmission of a coded bit.

Transmission of a physical channel with various payload sizes can be performed by using a polar code.

DESCRIPTION OF EXEMPLARY EMBODIMENTS

A wireless device may be fixed or mobile, and may be referred to as another terminology, such as a user equipment (UE), a mobile station (MS), a mobile terminal (MT), a user terminal (UT), a subscriber station (SS), a personal digital assistant (PDA), a wireless modem, a handheld device, etc. The wireless device may also be a device supporting only data communication such as a machine-type communication (MTC) device.

A base station (BS) is generally a fixed station that communicates with the wireless device, and may be referred to as another terminology, such as an evolved-NodeB (eNB), a base transceiver system (BTS), an access point, etc.

Hereinafter, it is described that the present invention is applied according to a 3rd generation partnership project (3GPP) long term evolution (LTE) based on 3GPP technical specification (TS). However, this is for exemplary purposes only, and thus the present invention is also applicable to various wireless communication networks.

Figure 1:
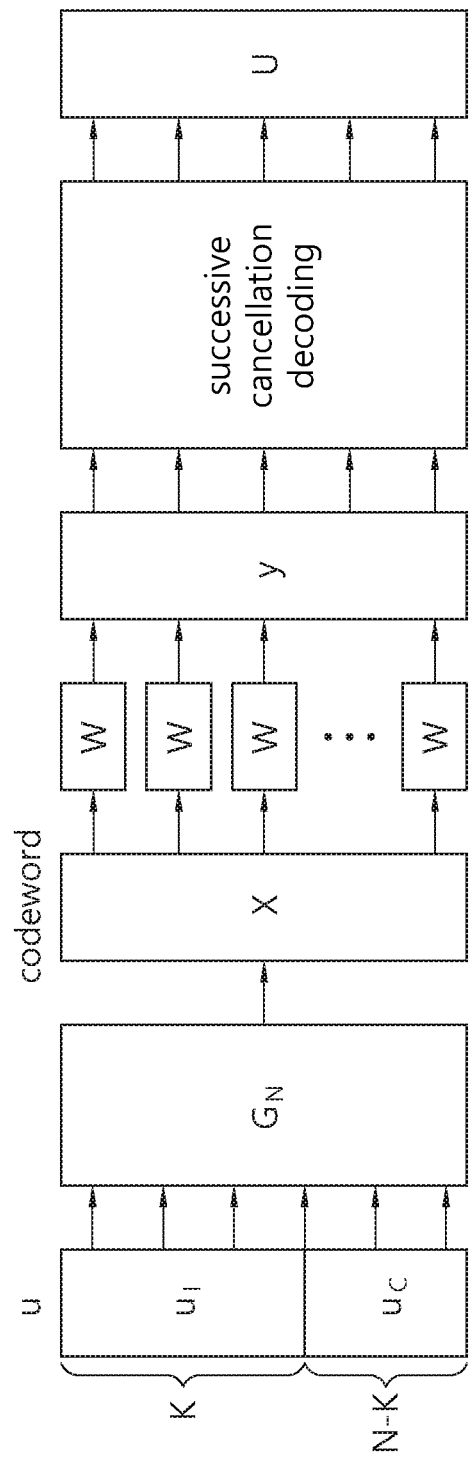
FIG. 1 shows an example of encoding and decoding of a polar code.

FIG. 1 shows an example of encoding and decoding of a polar code.

A binary-input discrete memoryless channel (B-DMC) is assumed. A block size is N under the assumption that a codeword size is N and a channel is used N times. There are N independent channels W to transmit a single codeword. In addition, channel polarization is acquired through channel combining and channel splitting.

An input vector u is a binary vector with a length N. An information bit consists of K bits, and a frozen bit consists of the remaining (N−K) bits. Positions of the information bits and frozen bits in the input vector are for exemplary purposes only, and are not limited thereto. The front bits may be arranged ahead of the information bits, or the front bits and the information bits may be arranged according to any input sequence. For example, assume that a length of the input vector is 8, and the number of information bits is 6. In an input sequence of {1, 1, 1, 1, 0, 1, 1, 0}, '1' may indicate a position at which the information bit is arranged, and '0' may indicate a position at which the front bit is arranged.

The frozen bit is also called as a dummy bit, and is a bit which is pre-known to both a transmitter and a receiver. A codeword X is generated by multiplying the input vector u by a coding matrix $G_N$. The coding matrix $G_N$ is obtained by a Kronecker product of $G_2$. However, obtaining of the coding matrix $G_N$ by combining power of 2 is for exemplary purposes only, and thus it may be obtained by combining power of various values.

$$G_2 = \begin{bmatrix} 1 & 0 \\ 1 & 1 \end{bmatrix} \quad \text{[Equation 1]}$$

$$G_4 = G_2 \otimes G_2 = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \quad \text{[Equation 2]}$$

$$G_8 = G_2 \otimes G_2 \otimes G_2 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 0 & 1 & 1 & 0 \\ 1 & 1 & 1 & 1 & 1 & 1 & 1 & 1 \end{bmatrix} \quad \text{[Equation 3]}$$

The codeword X is transmitted by using the channel W N times. The receiver performs decoding by using a reception vector y to obtain a vector U which is a predicted from an information vector u. A successive cancellation decoder may be used to decode a polar code. The successive cancellation decoder performs decoding sequentially starting from $u_1$. Previous decoded bits are completely trusted. $u_i$ is decoded based on the reception vector y and information of bits $U_1$ to $U_{i-1}$ of which decoding is previously complete. If $u_i$ is the frozen bit, decoding is performed as a pre-known bit.

Figure 2:
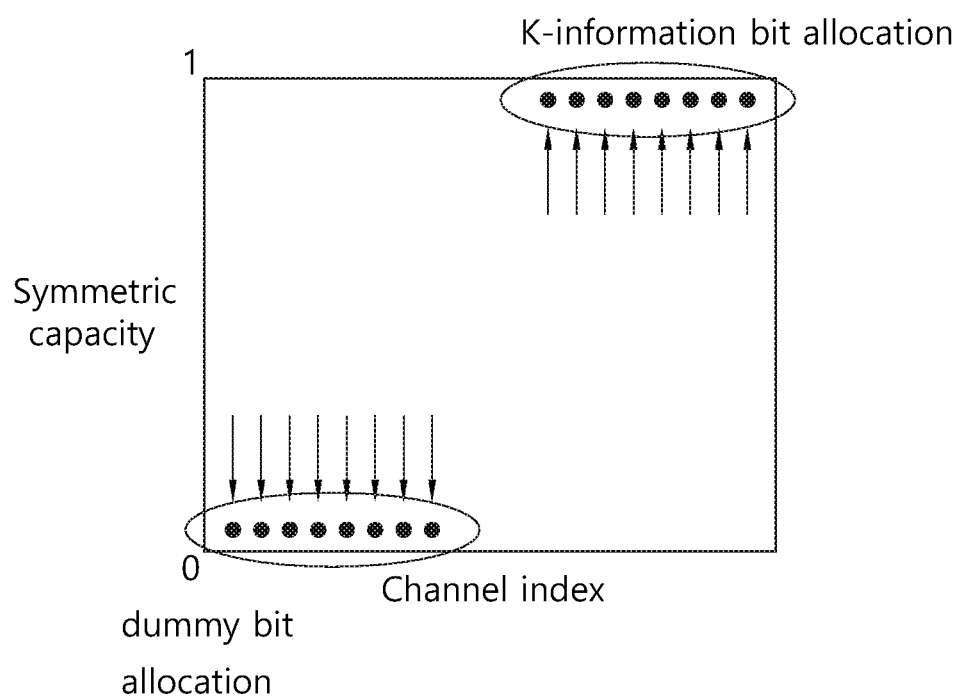
FIG. 2 shows a channel polarization and polar encoding process of a polar code.

FIG. 2 shows a channel polarization and polar encoding process of a polar code.

Referring to FIG. 2, a horizontal axis represents an index of each channel, and a vertical axis represents channel capacity of each channel, derived from a bit error rate.

When decoding is performed using a successive cancellation decoder, a unique phenomenon called channel polarization can be observed. Each channel from an information vector u to an estimate vector U is in an extremely good state or in an extremely bad state. In general, bits which are decoded first are biased to have low channel capacity, and bits which are decoded later converge to a complete channel Such a tendency can be inferred from a fact that the later bits require a greater amount of information when decoding is attempted in a successive cancellation decoding scheme.

The longer the length of a size N of a codeword X, the more serious the polarization of the channel. Eventually, therefore, only K channels having a channel capacity close to 1 and (N−K) channels having a channel capacity of 0 remain. In addition, the polarization of the channel is fixed for a given channel situation.

Polar encoding begins with a simple idea that only a good channel is used among polarized channels. That is, the remaining polar encoding process is also shown in FIG. 2. Since channel combination and decoding are fixed, how to select actual information bits are left. When a channel polarization phenomenon is observed for a sufficiently large N, a ratio of good channels against the total number N of channels is determined by a channel capacity C of a channel W. That is, the number of good channels is close to N*C. In general, an encoder allocates an information bit by selecting only a good channel, and allocates a fixed bit (a frozen bit or a dummy bit) to the remaining channels. In this case, even if the dummy bits are set to all zeros, generality is not lost. Then, bits through the good channel will be possibly decoded with a very low error rate, and the number of information bits is about N*C which is the number of good channels. Therefore, communication close to the channel capacity becomes possible.

The characteristics of the polar encoding structure and channel capacity communication are not established for a general binary input channel. Instead, a code structure itself implies achievement of the channel capacity.

Now, it is proposed to apply a polar code in transmission of a data channel or control channel of 3GPP. The control channel may include a physical channel for transmitting information required for communication between two communication nodes, such as DL scheduling information, UL scheduling information, hybrid automatic repeat request (HARQ) ACK/NACK information, channel state information (CSI), power control information, or the like. The control channel includes a downlink (DL) control channel and/or an uplink (UL) control channel. In 3GPP LTE, the DL control channel may be a physical downlink control channel (PDCCH), or the like, and the UL control channel may be a physical uplink control channel (PUCCH) or the like.

Figure 3:
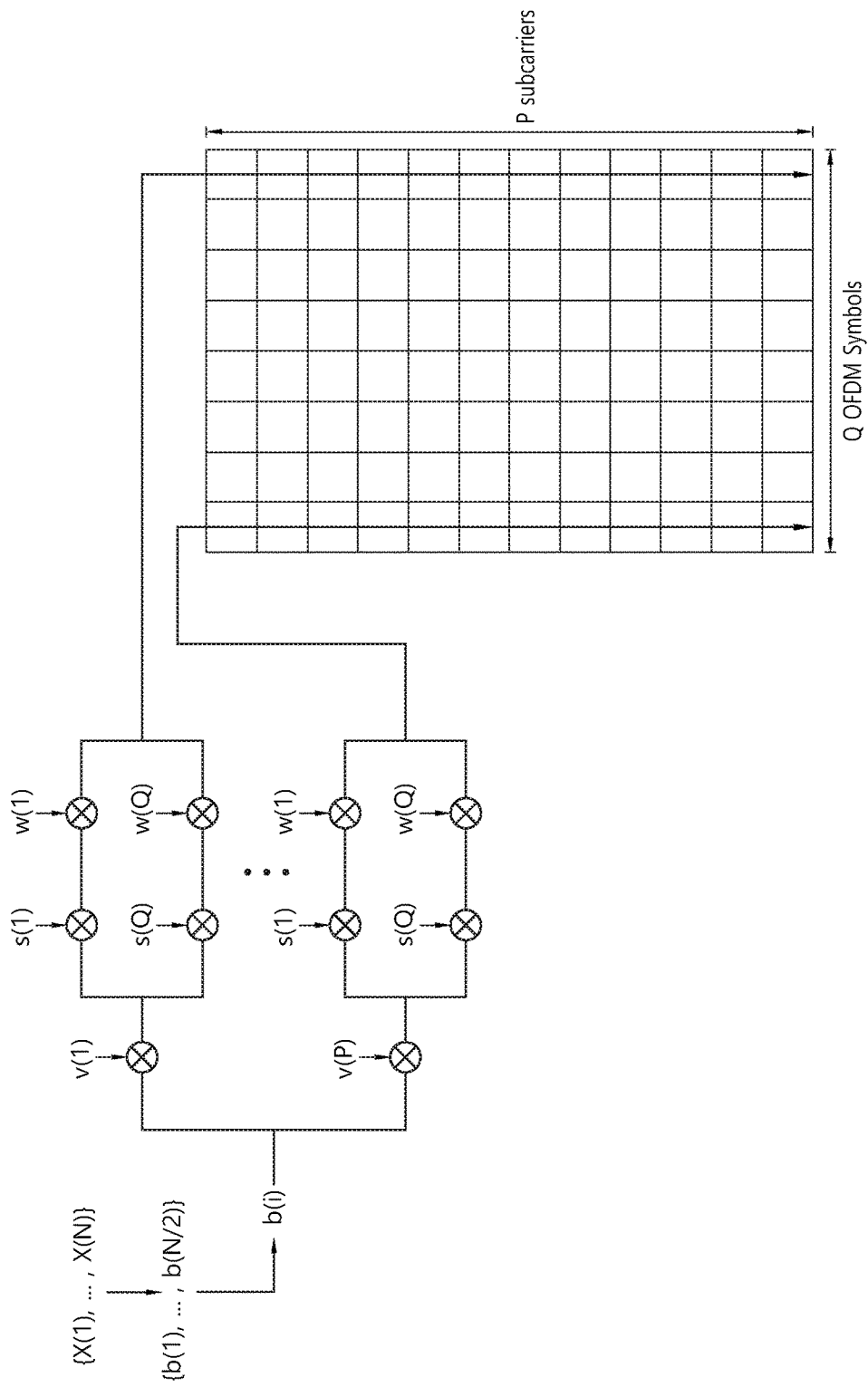
FIG. 3 shows an example of a channel to which an embodiment of the present invention is applied.

FIG. 3 shows an example of a channel to which an embodiment of the present invention is applied.

This channel is a UL control channel. Various payloads may be transmitted through P subcarriers and Q orthogonal frequency division multiplexing (OFDM) symbols. The values P and Q can be adjusted.

A codeword X with a size N is converted into N/2 modulation symbols through quadrature phase shift keying (QPSK) modulation. There is no restriction on the modulation scheme, and thus binary phase shift keying (BPSK), 8-PSK, or the like may also be used. Each modulation symbol is first multiplied by a spreading code {v(1), . . . , v(P)} of a size P. In addition, a sequence {s(1), . . . , s(Q)} of the size Q is multiplied, and then an orthogonal code {w(1), . . . , w(Q)} of the size Q is multiplied. Cyclic shift may be applied to the spreading code.

For convenience, the following definition is used to apply a polar code to a control channel.

K: the number of information bits input to the polar code

M: the number of bits to be actually transmitted through the control channel

R: a reference coderate of the control channel

N: A block size of the polar code or a size of the codeword or the number of bits of a mother code The values K and M may change for each control channel transmission. The control channel may be transmitted by combining a specific unit resource (e.g., control channel element (CCE)), and the number of bits that can be transmitted per unit resource may be fixed. If the number of unit resources for transmitting the control channel is defined as an aggregation level, the value M may be determined according to the aggregation level.

The above embodiment is merely an example of a control channel for carrying control information according to the present invention, and the present invention is not limited thereto. A plurality of modulation symbols generated by modulating information bits may be multiplied by a spreading code or a scrambling code, and thereafter may be transmitted by mapping a radio resource.

Figure 4:
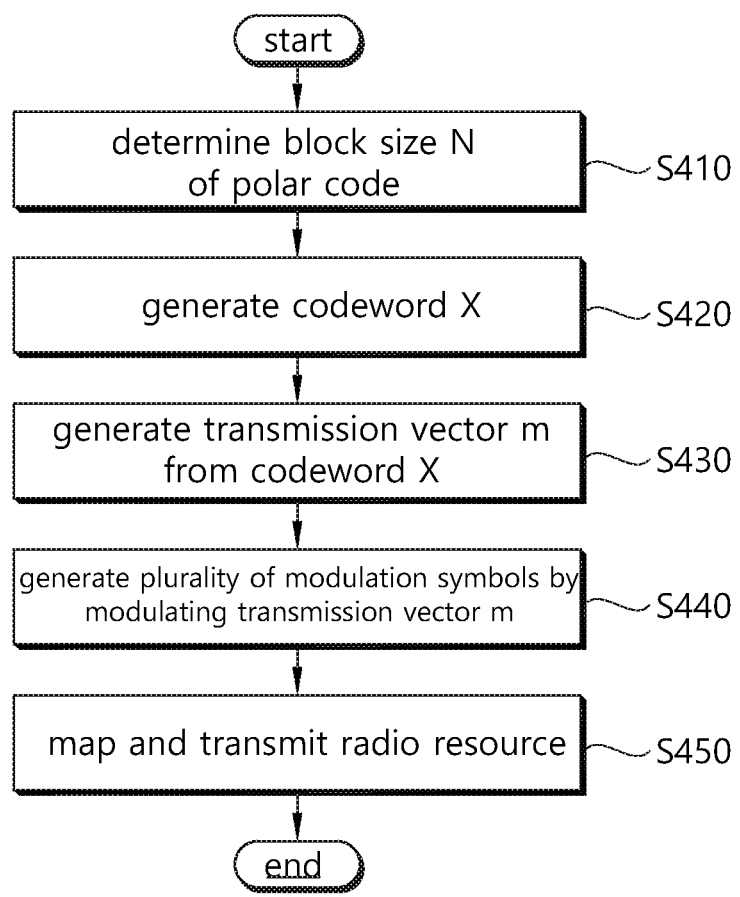
FIG. 4 shows a method of transmitting control information according to an embodiment of the present invention.

FIG. 4 shows a method of transmitting control information according to an embodiment of the present invention. This method may be performed by a transmitter, and the transmitter may be a wireless device or a base station.

In step S410, a block size N of a polar code is determined. This will be described later.

In step S420, an information bit u indicating control information is encoded using the polar code to generate a codeword X.

In step S430, according to M, a bit in the codeword X is punctured or added to generate a transmission vector m. Interleaving may be performed.

In step S440, the transmission vector m is modulated to generate a plurality of modulation symbols.

In step S450, the plurality of modulation symbols are mapped to a radio resource and are transmitted. Before mapping to the radio resource, if necessary, a spreading code or sequence may be multiplied to the modulation symbols In addition, the present specification proposes schemes in which a systematic polar code and a non-systematic polar code are properly used to be applied to rate matching and HARQ operations in an actual communication system. For convenience, the present specification uses the following definition.

K: the number of input information bits of the mother code

N: the number of coded bits of the mother code m: the number of coded bits to be actually transmitted at any time In the above case, if N denotes the number of coded bits of the mother code (or a size of a matrix G) of the polar code, N may be power of 2 according to a structure of the polar code. However, the polar code may be configured in a structure different from the aforementioned structure. For example, if a generation matrix of the polar code is configured by combining a 2×2 kernel matrix and a 3×3 kernel matrix, N may be limited to a combination of power of 2 and power of 3. In general, if an available value N in any polar code structure is expressed as N(i) (where N(0)<N(1)< . . . N(i)<N(i+1) . . . ), a polar code consisting of only the 2×2 kernel matrix may be expressed as $N(i)=2^n$, $N(i+1)=2^{(n+1)}$, $N(i+2)=2^{(n+2)}$.

It is assumed that, when (N, K) is determined in the above definition, a polar code encoder is determined to have a structure of an input of K information bits, (N−K) frozen bits, and an output of N bits, and a bit channel position of the K information bits is determined as a position having the greatest reliability among the N-bit channels through any scheme. In this case, if a bit channel index to which the K information bits is mapped is w(0), w(1), . . . , w(K−1)

(where 0≤w(i)≤N−1), it is assumed that the greater the value i, the greater the reliability of the bit channel w(i). Herein, the K information bits may include an error check code such as cyclic redundant check (CRC) or may be bits coded with an outer code for additional error correction.

An example of configuring a mother code as a polar code is expressed as follows by a matrix G extended in the form of a Kronecker product of a 2×2 matrix, an input vector u, and an output vector x.

$$[x_0, x_1, x_2, \ldots x_{N-1}] = [u_0, u_1, u_2, \ldots u_{N-1}] \begin{bmatrix} 1 & 0 & & 0 & 0 \\ 1 & 1 & \cdots & 0 & 0 \\ \vdots & & \ddots & & \vdots \\ 1 & 0 & & 1 & 0 \\ 1 & 1 & \cdots & & 1 & 1 \end{bmatrix}$$ [Equation 4]

In this case, assuming N=16, an example of a vector w consisting of w(i) is as follows.

$$W=[0\ 1\ 2\ 4\ 8\ 3\ 5\ 6\ 9\ 10\ 12\ 7\ 11\ 13\ 14\ 15]$$ [Equation 5]

In this case, 'a' may denote a vector obtained by orderly concatenating a bit-stream of (N−K) frozen bits f(0), f(1), f(2), ... f(N−K−1) and a bit-stream of K information bits i(0), i(1), i(2), ... i(K−1). Input positions of the information bit-stream and frozen bit-stream may be adjusted according to reliability of a bit channel in such a manner that a member of the vector 'a' is interleaved with reference to the vector w and is multiplied to a matrix G or a row of the matrix G is permutated with reference to the vector w and thereafter an input vector is multiplied thereto.

Hereinafter, an encoding scheme using a systematic polar code and a non-systematic polar code will be described. In the encoding scheme using the non-systematic polar code, an input information bit is not directly exhibited in an output bit. In the encoding scheme using the systematic polar code, the input information bit is directly exhibited in the output bit.

A typical systematic encoding scheme is as follows. First, a coding scheme defined as linear conversion through a field F is considered as follows.

$$x=uG,\ x,\ u \in \mathbb{F}^N,\ G \in \mathbb{F}^{N \times N}$$ [Equation 6]

For polar coding, we are interested in a case where F is a binary field and $F=F_2$. However, a result of this section is applied to any finite or infinite field.

In non-systematic polar coding, u is regarded as a source word, and x is regarded as a codeword. In practice, a code set of which a ratio is adjusted by splitting a source word into two parts such as u=(uA, uAc) (A ⊂ {1, . . . , N}) is defined by using Equation 6 above. A first part uA=(ui:i∈A) consists of user data that can be freely converted in each transmission round, whereas a second part uAc=(ui:i∈Ac) consists of a number known to a decoder by being fixed in an initial stage of a session. Equation 6 above may be written as follows.

$$x = \mathbf{u}_A \mathbf{G}_A + \mathbf{u}_{A^c} \mathbf{G}_{A^c}$$ [Equation 7]

Herein, $G_A$ and $G_{A^c}$ are partial matrices of G consisting of rows having indices A and $A^c$, respectively. Such mapping defines a non-systematic encoder. A code rate may be adjusted by selecting a size of a set A.

As shown in Equation 7 above, a code actualized by a non-systematic encoder is designated, and various and available systematic encoders are considered for this code. For this, a codeword may be divided such as $x=(x_B, x_B^c)$ (in this case, B is any subset of {1, . . . , N}). In addition, the codeword x may be written as follows.

$$\mathbf{x}_B = \mathbf{u}_A \mathbf{G}_{AB} + \mathbf{u}_{A^c} \mathbf{G}_{A^c B}$$

$$\mathbf{x}_{B^c} = \mathbf{u}_A \mathbf{G}_{AB^c} + \mathbf{u}_{A^c} \mathbf{G}_{A^c B^c}$$ [Equation 8]

Herein, $G_{AB}$ denotes a partial matrix of G consisting of a partial matrix different from that of element arrays of $G_{i,j}$ (i∈A,j∈B). Now, a systematic encoder in which $x_B$ plays a role of $u_A$ can be found. $u_A$ plays a role of a data carrier in non-systematic encoding. On the other hand, $u_A^c$ is fixed as before. More specifically, if sets of available values of $u_A$ and $x_B$ are one-to-one mapped in Equation 8 above, it can be said that there is a systematic encoder having a parameter (B, $u_A^c$) for a specific non-systematic encoder having a parameter (A, $u_A^c$).

Proposition 1: For all polar codes defined by some non-systematic encoders having a parameter (A, $u_A^c$), if A and B have the same number of elements and if GAB is an invertible matrix, there is a systematic encoder having a parameter (B, $u_A^c$). If a sufficient condition of the proposition 1 is satisfied, the systematic encoder having the parameter (B, $u_A^c$) may carry out mapping of $x=(x_B, x_B^c)$ by calculating $x_B$ as follows.

$$\mathbf{u}_A = (\mathbf{x}_B - \mathbf{u}_{A^c} \mathbf{G}_{A^c B})(\mathbf{G}_{AB})^{-1}$$ [Equation 9]

$u_A$ may be substituted to a lower formula of Equation 8 above to obtain $x_B^c$.

Now, a systematic encoding scheme for a polar code will be described.

Now, a result of the aforementioned description may be actualized with the polar code. First, a field is fixed to $F=F_2$ as a binary field. In addition, for any n≥1, a polar code of a block size $N=2^n$ may be defined to have an encoder of Equation 6. In this case, GN may be obtained as follows.

$$G_N = F^{\otimes n},\ F = \begin{bmatrix} 1 & 0 \\ 1 & 1 \end{bmatrix}$$ [Equation 10]

In this case, $F^{\otimes n}$ denotes $n^{th}$ Kronecker power of F. The followings are several major features of a generation matrix for a polar code.

1) The generation matrix is related by recursion as follows.

$$G_N = \begin{bmatrix} G_{N/2} & 0_{N/2} \\ G_{N/2} & G_{N/2} \end{bmatrix}$$ [Equation 11]

In this case, $0_{N/2}$ is a (N/2)*(N/2)-sized zero matrix.

2) $G_N$ is lower-triangular with elements on a diagonal line, and thus is invertible (in fact, an inverse of $G_N$ is $G_N$).

3) Any partial matrix $(G_N)A.A$ (A ⊂ {1, . . . , N}) of $G_N$ is also lower-triangular with elements on a diagonal line, and thus is also invertible.

A third property implies that, if A=B, the sufficient condition of the proposition 1 is maintained for the polar code. Accordingly, a choice is left for A, and the rest is set to B=A.

Proposition 2: Systematic encoding for the polar code may be performed at time O(N log(N)). A proof for this will be omitted.

Another method for systematic encoding uses a successive cancellation (SC) decoder as an encoder. For this, it is assumed that x is transmitted through a binary erasure channel (BEC), and a user data part $x_A$ is directly received while completely cancelling the remaining part $x_A{}^c$. The decoder is properly initialized to apply a complete knowledge for ($u_A{}^c$, $X_A$) and a complete uncertainty for ($u_A$, $x_A{}^c$). The fact that the decoder will always find $u_A$ correctly may be exhibited by recursive arguments.

The polar code is defined by a generation matrix different from Equation 10 above based on a post permutation operation as follows.

$$G_N = F^{\otimes n} \Pi_N \qquad \text{[Equation 12]}$$

Herein, $\Pi_N$ is an N*N permutation matrix. In fact, the standard form of the polar coding as described in Equation 6 applies a permutation corresponding to a bit-reversal operation. In this case, a systematic encoder may be configured by selecting sets A and B such that B is an image of A under a permutation expressed as $\Pi_N$.

Figure 5:
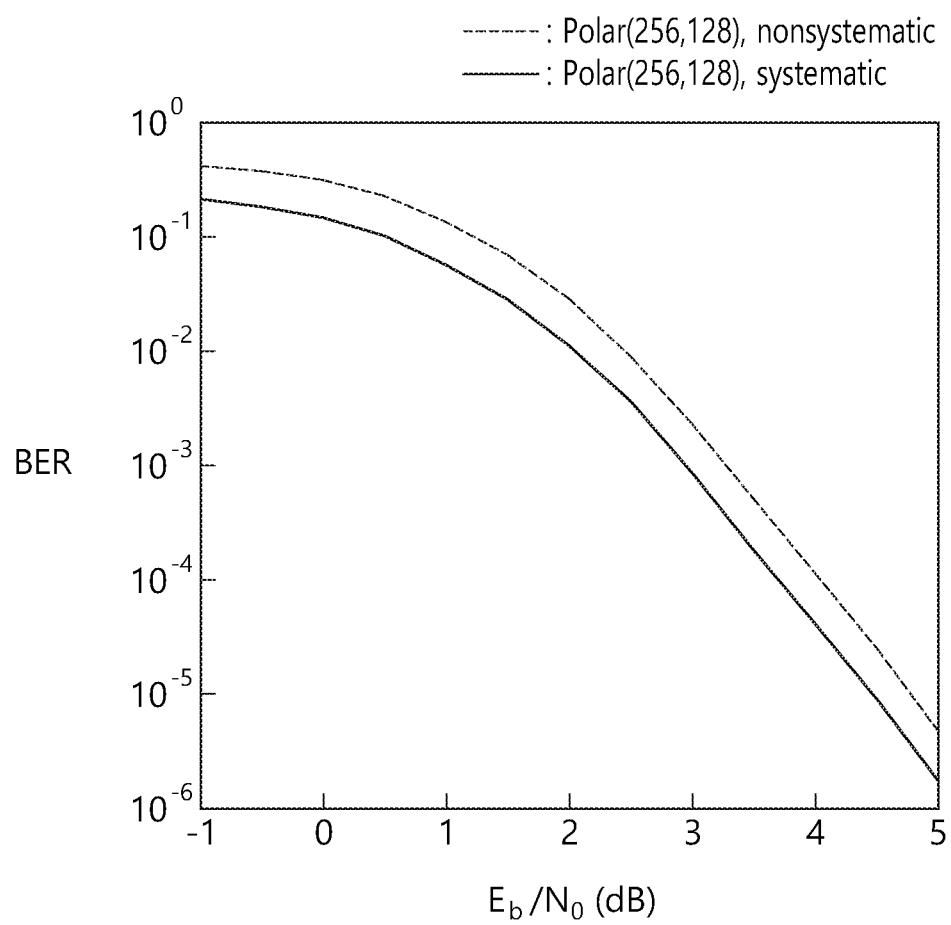
FIG. 5 shows a simulation result of a systematic polar code and a non-systematic polar code.
Figure 6:
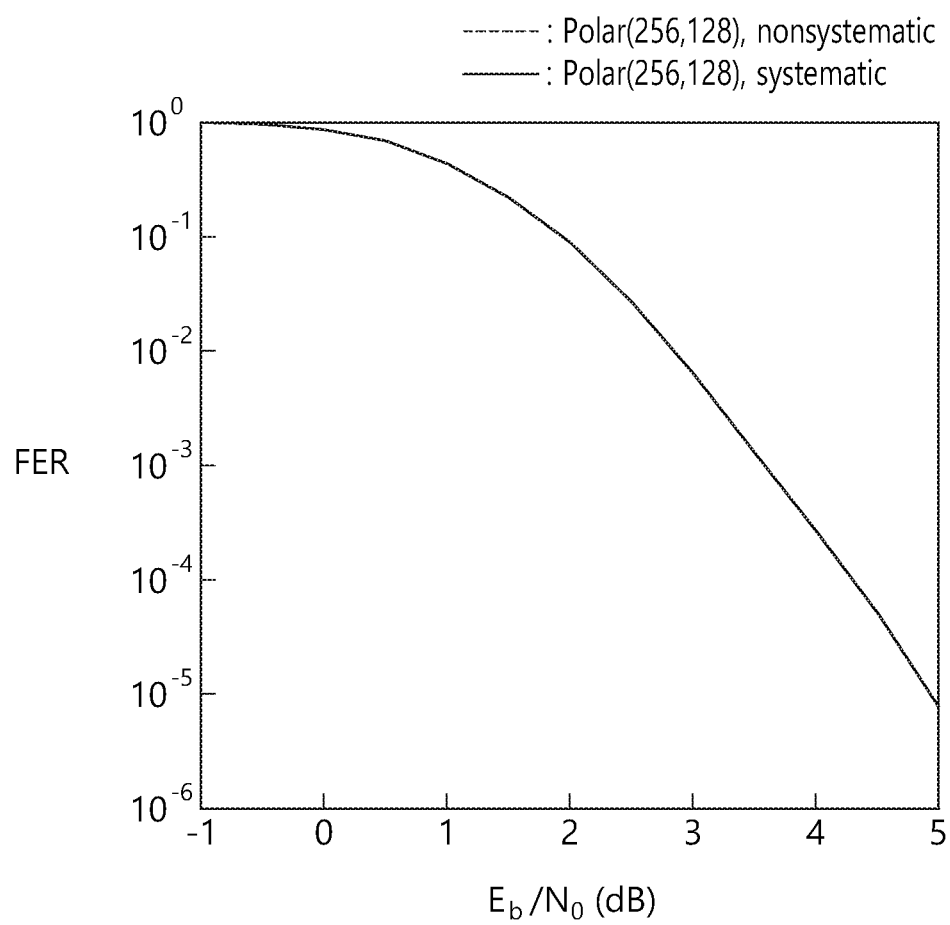
FIG. 6 shows a simulation result of a systematic polar code and a non-systematic polar code.

FIG. 5 and FIG. 6 show a simulation result of a systematic polar code and a non-systematic polar code. Bit error rate (BER) performance is compared in FIG. 5, and frame error rate (FER) performance is compared in FIG. 6.

A simulation result is shown in FIG. 5 and FIG. 6 to show a performance benefit of a systematic polar code. The simulation is performed by using a polar code having a length N=256 and a rate value of ½ in an additive white Gaussian noise (AWGN) channel Binary phase shift keying (BPSK) is applied in modulation. In particular, a codeword x generated by the polar encoder is mapped to a BPSK signal $s \in \{-1, +1\}^N$. The BPSK signal s is expressed as follows.

$$s_i = \begin{cases} +1 & \text{for } x_i = 0 \\ -1 & \text{for } x_i = 1 \end{cases} \qquad \text{[Equation 13]}$$

The equivalent AWGN channel may be expressed as y=s+z. In this case, $z=(z_1, \ldots, z_N)$ and it is i.i.d. of a set of Gaussian random variables with means 0 and variance No/2.

The decoder used in the simulation is the SC decoder described in Equation 6 above.

FIG. 5 and FIG. 6 show a result of Eb/No with respect to BER and FER, respectively. The parameter Eb denotes transmitted signal energy per source bit, and is 2 herein. A set A for the polar coding is optimized for an operation at Eb/No=1 (0 dB) (herein, Eb/No=0.188 dB is a Shehnon's limit). A simulation using a polar code optimized to operate at a different Eb/No value does not show much difference from the simulation result reported in FIG. 5 and FIG. 6.

As a result, it can be seen that the systematic polar code has similar FER performance and better BER performance, compared to the non-systematic polar code. Performance improvement is particularly noticeable at a low Eb/No value for which a BER curve is relatively flat.

For convenience, it is assumed in the present specification that an output bit set X={x(0), x(1), x(2), . . . , x(N−1)} consists of a sum of a systematic bit set (i.e., an input information bit set) S={a(0), a(1), a(2), . . . a(K−1)} and a parity bit set (i.e., a non-systematic bit set) P={p(0), p(1), . . . , p(2), p(N−K−1)}.

An HARQ transmission scheme in which the non-systematic polar code and the systematic polar code are properly used is as follows.

In an embodiment 1, a third coded bit is transmitted, which is obtained through a combination of a first coded bit obtained by applying the non-systematic polar encoding to identical K-bit information and a second coded bit obtained by applying the systematic polar encoding to identical K-bit information.

In case of the non-systematic polar code, a relation between an encoder input information and each coded bit is complex if a size N of a mother code is great. Thus, if m<M, it is difficult to know which coded bit is not to be sent. That is, it is difficult to know which coded bit is punctured to obtain an optimal coding gain. On the other hand, in case of the systematic polar code, since the coded bit is split into a systematic bit and a parity bit, adjustment between a coding gain and decoding possibility based on punctured bit selection is relatively easy. Therefore, a transmission scheme in which the non-systematic polar code and the systematic polar code are combined may be introduced.

Specifically, it is assumed that X_ns denotes a coded bit set obtained by applying the non-systematic polar encoding to an identical information bit-stream i=[i(0), i(1), i(2), . . . i(K−1)], and X_s denotes a coded bit set obtained by applying the systematic polar encoding. In this case, information transmission may be performed based on X' by configuring a coded bit set X' consisting of a subset X_ns' of X_ns and a subset X_s' of X_s.

In an embodiment 2, X_s' of the embodiment 1 consists of only a member of P or the member of P is preferentially included. When configuring X', to maximize a coding gain, X_s' which constitutes X' may consist of all or some of members of P or may consist of a union of all members of P and some members of S (Herein, S is a systematic bit set (S={a(0), a(1), a(2), . . . a(K−1)}), P is a parity bit set (P={p(0), p(1), p(2), . . . , p(N−K−1)}). The same applies to the following example).

In an embodiment 3, X_s' of the embodiment 1 consists of only a member of S or the member of S is preferentially included. When configuring X', to ensure minimum decoding performance, X_s' which constitutes X' may consist of all or some of members of S or may consist of a union of all members of S and some members of P.

In an embodiment 4, if puncturing is required for X' of the embodiment 2, X_s' may be preferentially punctured. As shown in the embodiment 2, if puncturing is required for the entire coded bit X' when X_s' consists of mainly a parity bit, coded bits belonging to X_s' may be preferentially punctured.

In an embodiment 5, if puncturing is required for X' of the embodiment 3, X_ns' may be preferentially punctured. As shown in the embodiment 3, if puncturing is required for the entire coded bit X' when X_s' consists of mainly a systematic bit, coded bits belonging to X_ns' may be preferentially punctured.

In an embodiment 6, in case of HARQ transmission of the embodiment 2, X_ns' may be preferentially transmitted. As shown in the embodiment 2, upon performing HARQ transmission in which part of the entire coded bit X' is transmitted when X_s' consists of mainly a parity bit, coded bits belonging to X_ns' may be preferentially punctured compared to bits belonging to X_s'.

In an embodiment 7, in case of HARQ transmission of the embodiment 3, X_s' may be preferentially transmitted. As shown in the embodiment 3, upon performing HARQ transmission in which part of the entire coded bit X' is transmitted when X_s' consists of mainly a systematic bit, coded bits belonging to X_s' may be preferentially punctured compared to bits belonging to X_ns'.

In addition, self-decodable transmission may also be considered.

In an embodiment 8, when transmitted repeatedly through a plurality of packets by applying systematic polar coding to identical information, transmission may be performed by including a systematic bit into each transmission packet.

As described in the above embodiment, X_s denotes a coded bit set obtained by applying systematic polar coding to K-bit input information, and X_s may consist of a systematic bit set S and a parity bit set P. In this case, if X'(i) denotes a coded bit set which constitutes an i-th transmission packet for identical input information, X' (i) may consist of S and P'(i). In this case, P'(i) is a subset of P, and may change for every i-th packet. That is, X'(i) consists of all systematic bits and some parity bits selected for every transmission packet (S+P'(i)).

As a specific example, in a 3GPP LTE system or a new RAT (NR) system which is being developed as a 5G communication system in 3GPP, an eNB may repeatedly transmit K-bit system information through a physical broadcast channel (PBCH) or a new PBCH (NPBCH) across n subframes. In this case, parity bits which change per subframe and identical K systematic bits may be transmitted among coded bits subjected to systematic polar encoding through the PBCH transmitted in each subframe.

In addition, a code configuration scheme in which a polar code is applied to transmission of an information bit with a variable size will be described as another embodiment of a system to which the present invention is applied. For convenience, the following definition is used in the present specification.

K: the number of input information bits of the mother code

N: the number of coded bits of the mother code a: the number of information bits requiring actual transmission at any time (a≤K)

m: the number of coded bits to be actually transmitted at any time

The UE may transmit HARQ response information (hereinafter, ACK/NACK (AN) information) for data packets transmitted by the eNB to the UE. In this case, the number of AN information bits to be transmitted by the UE at any time may vary depending on the number of data packets received by the UE. That is, the value 'a' defined above may change every time. The present specification proposes a method of determining values N and K for polar code encoding when the value 'a' varies, and a method of arranging information bits. However, apparently, the present specification is applicable to information transmission of a radio node (e.g., eNB or the like) other than the UE or to transmission of variable-sized information in addition to control information.

1. When the Value m is Fixed

When a specific physical channel configured of a fixed amount of resources such as a physical uplink control channel (PUCCH) of an LTE system is used in information transmission, the number of coded bits that can be transmitted through the physical channel may be fixed irrespective of the number of input information bits. Therefore, the value m is fixed depending on the physical channel. In this case, a polar code encoding scheme may be applied as follows.

In an embodiment 1, the values N and K are fixed, and 'a' bits corresponding to actually valid information may be transmitted through positions having the greatest reliability among K input bit positions, and a predetermined value may be transmitted through the remaining (K−a) bit positions.

In the above scheme, the value K is fixed to a value greater than or equal to all available values 'a', and the value N is determined to a value capable of supporting a minimum code rate appropriately according to the value K. In this case, if 'a' denotes the number of actual information bits to be transmitted at any time, the information bit is input at 'a' positions having high reliability among K bit channel input positions, and a predetermined value (0 or 1, or particularly, the same value as the frozen bit) is transmitted at the remaining (K−a) positions. That is, the predetermined value is transmitted at a position of an AN information bit at which downlink control information (DCI) is not received.

In an embodiment 2, the values N and K may be determined based on the value 'a'. In this case, the UE may restrict applicable combinations of values N and K, and the eNB may select a decoding result of a specific combination based on a result of performing decoding on available combinations of the values N and K.

The UE determines the value K as K=a, or if there is a restriction on available values K, determines the value K as the smallest value satisfying K≥a among the available values K. The value N is determined by the determined value K and a target code rate in this case. The UE transmit polar-encoded information with the (N, K) configuration by adding bits of which (K−a) values are predetermined to the 'a'-bit information. In this case, 'a' bits and (K−a) bits may be arranged according to the embodiment 1 (that is, an information bit is input at 'a' positions having high reliability among K bit channel input positions, and a predetermined value is transmitted at the remaining (K−a) positions).

If the eNB does not know an information bit size 'a' transmitted by the UE or a combination of (N, K) based thereon, decoding may be performed by assuming a plurality of available combinations of (N, K), and a decoding result of a specific combination among them may be selected. A criterion of selecting the combination of (N, K) may conform to a CRC check result when an LLR value finally obtained in the decoding of each combination of (N, K) or an error check code such as CRC is included in an information bit.

2. When the Value m is Variable

When a physical channel configured of a variable amount of resources such as a physical uplink scheduled channel (PUSCH) which is a physical channel on which data is transmitted is used for information transmission in an LTE system, or when one of a plurality of PUCCH formats supporting different amounts of resources is selected, the number of coded bits that can be transmitted through the physical channel at any time may change. For example, if K denotes the maximum number of ACK information bits that can be transmitted through the PUCCH, the number of bits allocated to DCI or a PUSCH is actually 'a' less than K.

In this case, a polar code encoding scheme may be applied as follows.

In an embodiment 3, the value m may be determined based on the value 'a' of the embodiment 1.

When the value m is variable in the embodiment 1, the value m may be determined by considering a code rate r based on the value 'a'. That is, a mother code size N is determined as K/R or a number close thereto according to K corresponding to the maximum number of available information bits and the code rate R. However, the number of coded bits to be actually transmitted among N bits is determined as a/r or a number close thereto, thereby avoiding transmission of unnecessarily many coded bits.

The embodiments 1 to 3 may be applied to AN information transmission of the UE, and it may be assumed that 'a' denotes the number of AN information bits to be transmitted according to a DL packet actually received by the UE at any time. In this case, AN information ('a' bits) corresponding to the received DL packet may be input at 'a' positions having high reliability and NACK information may be input at the remaining (K−a) bits to perform transmission through polar encoding. For example, if N=16, K=8, a=6, and if bit channel reliability conforms to Equation 5 above, the UE transmits AN information for 6 DL packets actually received at positions 15, 14, 13, 11, 7, 12, transmits NACK at positions 10 and 9, and transmits a froze bit as the remaining portion (W=[0 1 2 4 8 3 5 6/9 10/12 7 11 13 14 15]). In particular, for an NACK information value, the same value as the frozen bit may be applied.

In this case, in order to avoid inconsistency of an AN information arrangement order between the UE and the eNB, the eNB may transmit an order value (corresponding to a DL downlink assignment index (DAI) in an LTE system) together, and the UE may arrange the AN information at 'a' input positions according to a corresponding order value. In this case, even if there is a missing order value in the middle, NACK may be transmitted at a corresponding AN information input position by regarding that a packet corresponding to that order value is transmitted by the eNB.

In an embodiment 4, the value 'a' may be separately transmitted in an AN information transmitting end (UE).

A case may be assumed where the eNB transmits a data packet and the UE transmits an AN feedback for this. In this case, in preparation for a case where the number of data packets actually transmitted by the eNB and the number of data packets received by the UE are mismatched, the UE may inform the number 'a' of AN feedbacks transmitted by the UE to the eNB through additional signaling. In doing so, when decoding an AN feedback subjected to polar coding encoding, the eNB may increase decoding performance by performing decoding under the assumption that (N−a) bits, not (N−K) bits, are frozen bits among the N input bits. Herein, in order to decrease a signaling overhead of the value 'a' of the UE, the UE may the value 'a' quantized according to a range of the value 'a' instead of the exact value 'a'. In this case, the eNB may perform decoding by assuming (N−'a) frozen bits.

In an embodiment 5, an arrangement order for inputting 'a' bit AN information may be adjusted only within a limited bit position.

According to a characteristic of a polar code, a reliability order within all input bit positions may change depending on a change of the value m also for the same value N. In this case, when an arrangement order by which 'a'-bit AN information is input is changed to any input bit position according to the value m, encoding/decoding complexity may increase more than necessary. Therefore, when an input position of 'a'-bit AN information is adjusted according to the value m, there may be restriction such that the adjustment is achieved only within a specific bit position. Such a restriction may be indicated by using a sequence. For example, if K' denotes an available maximum value 'a', K' input bit positions may be fixed by assuming m=M or a specific reference value m, and if an actual value m is different from the reference value, an input order of 'a' bits may be arranged differently only within the K' input bit positions determined in this manner.

Alternatively, a plurality of values K' are set such as K'(0)<K'(1), . . . <K'(X), an input bit position is defined for each value of K'(i), and thereafter if the number of actual input bits is 'a', an input order of 'a' bits may be adjusted only within an input bit position defined based on a smallest value of K'(i) when a≤K'(i).

For example, if it is assumed that N=16 and K'=8 in the example of Equation 5 above, an input position for 8 information bits may be defined as [9,10,12,7,11,13,14,15]. Therefore, 'a' information bits may be arranged preferentially in an index order of 15→14→13→11→7→12→10→9, and if m<16, may be arranged in another order within the same index set.

Figure 7:
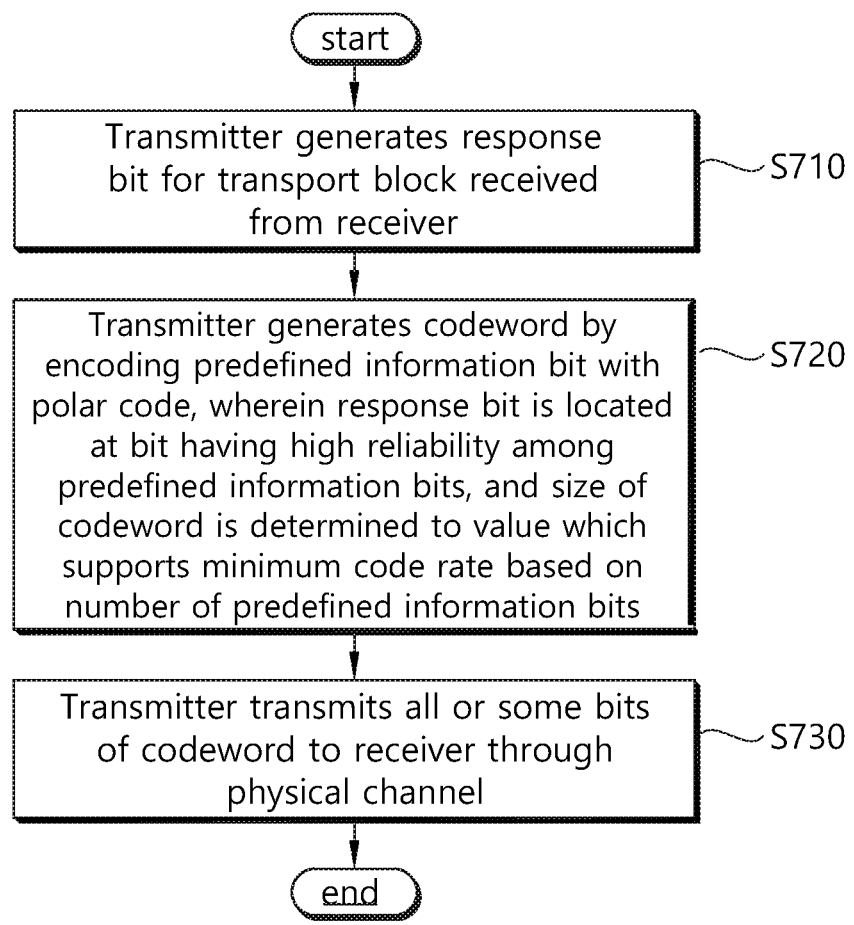
FIG. 7 is a flowchart showing a procedure of an HARQ transmission scheme based on a polar code according to the present embodiment.

FIG. 7 is a flowchart showing a procedure of an HARQ transmission scheme based on a polar code according to the present embodiment.

First, summarizing terminologies, a transmitter may be a UE, and a receiver may be an eNB.

In step S710, the transmitter generates a response bit for a transport block received from the receiver.

That is, the receiver may first transmit to the transmitter a data packet including at least one transport block. Herein, it is assumed and described that a response bit indicating ACK/NACK exists for each transport block. For example, if two transport blocks are received, the transmitter may generate a response bit indicating whether ACK/ACK exists for each transport block by using 2 bits. However, this is only one example, and the present invention is not limited to the above embodiment.

In step S720, the transmitter encodes a predefined information bit with the polar code to generate a codeword. The response bit is located at a bit having high reliability among the predefined information bits.

The predefined information bit may correspond to an input bit of an encoder which performs encoding with the polar code. The number of the predefined information bits may be K. 'a' may denote the number of bits having high reliability among the predefined information bits or the number of the response bits. 'a' may be less than or equal to K. If 'a' is less than K, the response bit may be repeated to configure an information bit to be input to the polar coding encoder.

However, the K bits are not limited to only the predefined information bits, but may correspond to K predefined information bit positions. The 'a' bits may be in a highly reliable order or position at the K predefined information bit positions. Alternatively, the 'a' bits may be in a predetermined order or position at the K predefined information bit positions.

If 'a' is determined as the number of information bits, the value N may vary depending on the value 'a', or a position of an input bit of a highly reliable encoder may vary depending on the value 'a'. However, this operation may become complicated since there is a need to always know the value 'a' which changes dynamically between the UE and the eNB. Therefore, N is obtained based on a predefined value K, and the position of the input bit of the highly reliably encoder is also obtained within the range of the value K, thereby decreasing operational complexity.

The codeword is a value obtained by multiplying the input bit including the information bit and the frozen bit by the coding matrix $G_N$, and the size of the codeword may be expressed by N. The size of the codeword may correspond to the block size of the polar code or the number of bits of the mother code. That is, the codeword may correspond to an output bit of an encoder which performs encoding with the polar code.

A size of the codeword is determined to a value which supports a minimum code rate based on the number of the predefined information bits.

In step S730, the transmitter transmits all or some bits of the codeword to the receiver through a physical channel.

The all or some bits of the codeword may correspond to a transmission vector m or a coded bit to be actually transmitted at any time. Herein, it is assumed that the all or some bits of the codeword correspond to the coded bit to be actually transmitted at any time. The number of coded bits to be actually transmitted at any time may be denoted by m. That is, a bit in the codeword may be punctured or added to generate m bits.

The codeword is transmitted through the physical channel, and an amount of a radio resource used in transmission of the physical channel may be fixed. Then, the number m of coded bits to be actually transmitted may be fixed irrespective of the number of information bits.

In addition, a predefined value may be transmitted in (K−a) bits excluding the bit having the high reliability among the predefined information bits. The predefined value may be the same as 0, 1, a NACK information value, or a frozen bit. In particular, the same value as the frozen bit may be applied to the NACK information value.

In addition, the codeword may correspond to an output bit of an encoder which performs encoding with the polar code. A value of the codeword size may be N. The N may be power of 2 or a combination of power of 2 and power of 3. The value N of the codeword size may be greater than the number K of the information bits, and (N−K) frozen bits may be encoded with the polar code together with the predefined information bit.

An amount of a radio resource used in transmission of the physical channel may be variable. In this case, the number of all or some bits of the codeword may be determined as a value supporting a code rate of the physical channel. Accordingly, the number of coded bits to be actually transmitted at any time may have a value of (the number of response bits)/(a code rate of a physical channel) or may have a value close thereto, thereby avoiding unnecessary transmission of a coded bit.

Figure 8:
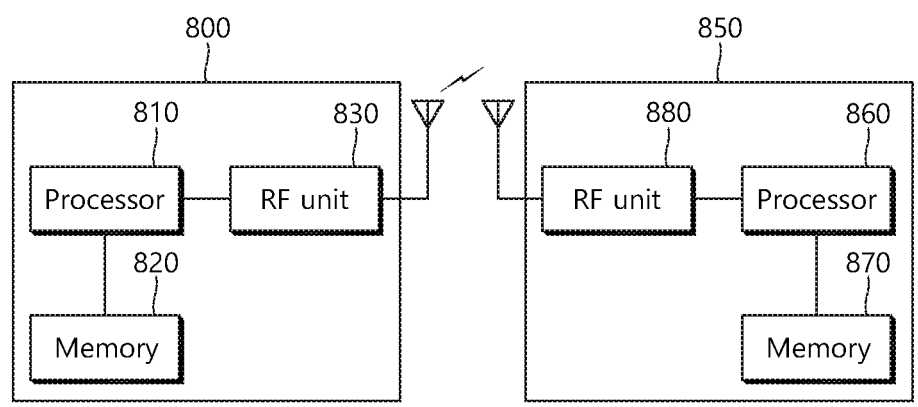
FIG. 8 is a block diagram showing a wireless communication system for implementing an embodiment of the present invention.

FIG. 8 is a block diagram showing a wireless communication system for which an embodiment of the present invention is implemented.

A transmitter 800 includes a processor 810, a memory 820, and a transceiver (or radio frequency (RF) unit) 830. The memory 820 is coupled to the processor 810, and stores a variety of information for driving the processor 810. The transceiver (or RF unit) 830 is coupled to the processor 810, and transmits and/or receives a radio signal. The processor 810 implements the proposed functions, procedures, and/or methods. In the aforementioned embodiment, an operation of the transmitter may be implemented by the processor 810.

A receiver 850 includes a processor 860, a memory 870, and a transceiver (or RF unit) 880. The memory 870 is coupled to the processor 860, and stores a variety of information for driving the processor 860. The transceiver (or RF unit) 880 is coupled to the processor 860, and transmits and/or receives a radio signal. The processor 860 implements the proposed functions, procedures, and/or methods.

The processor may include Application-Specific Integrated Circuits (ASICs), other chipsets, logic circuits, and/or data processors. The memory may include Read-Only Memory (ROM), Random Access Memory (RAM), flash memory, memory cards, storage media and/or other storage devices. The transceiver may include a baseband circuit for processing a radio signal. When the above-described embodiment is implemented in software, the above-described scheme may be implemented using a module (process or function) which performs the above function. The module may be stored in the memory and executed by the processor. The memory may be disposed to the processor internally or externally and connected to the processor using a variety of well-known means.

In the above exemplary systems, although the methods have been described based on the flowcharts using a series of the steps or blocks, the present invention is not limited to the sequence of the steps, and some of the steps may be performed at different sequences from the remaining steps or may be performed simultaneously with the remaining steps. Furthermore, those skilled in the art will understand that the steps shown in the flowcharts are not exclusive and may include other steps or one or more steps of the flowcharts may be deleted without affecting the scope of the present invention.

What is claimed is:

1. A method of performing hybrid automatic repeat request (HARQ) based on a polar code, the method comprising:

generating, by a transmitter, response bits for a transport block received from a receiver;

generating, by the transmitter, a codeword by encoding a predefined information bit with the polar code; and transmitting, by the transmitter, all or some bits of the codeword to the receiver through a physical channel, wherein the response bits are located at bits having high reliability among the predefined information bits, wherein a size of the codeword is determined to a value which supports a minimum code rate based on a number of the predefined information bits, and wherein, based on an amount of a radio resource used in transmission of the physical channel being variable, a number of all or some bits of the codeword is determined as below:

(a number of the response bits)/(a code rate of the physical channel).

2. The method of claim 1, wherein if an amount of a radio resource used in transmission of the physical channel is fixed, wherein the predefined information bit is an input bit of an encoder which performs encoding with the polar code, wherein the number of predefined information bits is K, wherein 'a' denotes a number of bits having the high reliability among the predefined information bits or the number of the response bits, and wherein 'a' is less than or equal to K.

3. The method of claim 2, wherein a predefined value is transmitted in (K−a) bits excluding the bit having the high reliability among the predefined information bits.

4. The method of claim 3, wherein the predefined value is the same as 0, 1, a NACK information value, or a frozen bit.

5. The method of claim 2, wherein the codeword is an output bit of an encoder which performs encoding with the polar code, wherein a value of a size of the codeword is N, and wherein the N is power of 2 or a combination of power of 2 and power of 3.

6. The method of claim 5, wherein the N is greater than the K, and the frozen bit is encoded with the polar code together with the predefined information bit, and wherein a number of frozen bits is N−K.

7. A transmitter performing hybrid automatic repeat request (HARQ) based on a polar code, the transmitter comprising:

a radio frequency (RF) unit that transmits and receives a radio signal; and a processor controlling the RF unit, wherein the processor is configured to:

generate response bits for a transport block received from a receiver;

generate a codeword by encoding a predefined information bit with the polar code; and transmit all or some bits of the codeword to the receiver through a physical channel, wherein the response bits are located at bits having high reliability among the predefined information bits, wherein a size of the codeword is determined to a value which supports a minimum code rate based on a number of the predefined information bits, and wherein, based on an amount of a radio resource used in transmission of the physical channel being variable, a number of all or some bits of the codeword is determined as below:

(a number of the response bits)/(a code rate of the physical channel).

* * * * *